United States Patent [19]

Toreki et al.

[11] Patent Number: 5,418,214
[45] Date of Patent: May 23, 1995

[54] CUPRATE-TITANATE SUPERCONDUCTOR AND METHOD FOR MAKING

[75] Inventors: Robert Toreki; Kenneth Poeppelmeier, both of Evanston; Bogdan Dabrowski, Bolingbrook, all of Ill.

[73] Assignee: Northwestern University, Evanston, Ill.

[21] Appl. No.: 110,576

[22] Filed: Aug. 23, 1993

Related U.S. Application Data

[63] Continuation of Ser. No. 916,338, Jul. 17, 1992, abandoned.

[51] Int. Cl.$^6$ ............... H01B 12/00; H01L 39/12
[52] U.S. Cl. ............... 505/125; 505/778; 505/780; 505/781; 505/785; 252/518; 252/521
[58] Field of Search ............... 505/1, 778, 780, 781, 505/785; 252/518, 521

[56] References Cited

U.S. PATENT DOCUMENTS

| | | | |
|---|---|---|---|
| 3,167,692 | 1/1965 | Matthias | 317/158 |
| 3,188,530 | 6/1965 | Matthias | 317/158 |
| 3,215,569 | 11/1965 | Kneip, Jr. et al. | 148/133 |
| 3,271,200 | 9/1966 | Zwicker et al. | 148/11.5 |
| 3,310,398 | 3/1967 | Kneip, Jr. | 75/134 |
| 3,416,917 | 12/1968 | DeSorbo | 75/174 |
| 3,511,720 | 5/1970 | Raymond | 148/133 |
| 3,671,226 | 6/1972 | Komata et al. | 75/175.5 |
| 3,817,746 | 6/1974 | Tsuei et al. | 75/153 |
| 3,867,209 | 2/1975 | Horiuchi et al. | 148/12.7 |
| 4,190,701 | 2/1980 | Howe et al. | 428/662 |
| 4,438,214 | 3/1984 | Masuyama et al. | 501/136 |
| 4,483,933 | 11/1984 | Kobayashi et al. | 501/136 |
| 4,519,942 | 5/1985 | Yamaoka et al. | 252/520 |
| 4,781,859 | 11/1988 | Noi | 252/520 |
| 4,900,536 | 2/1990 | Snyder et al. | 423/593 |
| 4,970,195 | 11/1990 | Bhargava et al. | 505/1 |
| 4,990,411 | 2/1991 | Nakayama et al. | 428/614 |
| 5,006,957 | 4/1991 | Kumagai et al. | 361/321 |
| 5,017,551 | 5/1991 | Agostinelli et al. | 505/1 |
| 5,034,373 | 7/1991 | Smith et al. | 505/1 |
| 5,049,543 | 9/1991 | Van Der Kolk et al. | 505/1 |
| 5,063,200 | 11/1991 | Okada et al. | 505/1 |
| 5,077,265 | 12/1991 | Ritter | 505/1 |
| 5,098,798 | 3/1992 | Smathers | 428/930 |
| 5,116,429 | 5/1992 | Wong | 29/599 |

OTHER PUBLICATIONS

Abstract of JP 5-78102 Mar. 1993.
Jin et al "High $T_c$ Superconductors—Composite Wire . . . " Appl. Phys. Lett 51(3) Jul. 1987 pp. 203-204.
Den, et al., "Preparation and Properties of YSr$_2$Cu$_{3-x}$M$_x$O$_y$ (M=Li, Al, Ti, V, Cr, Fe, Co, Ga, Ge, Mo, W and Re)," Physica, 1992, pp. 141-152. Jun. 19, 1992.
Slater, et al., "Synthesis and Structural Characterisation of YSr$_2$Cu$_{3-x}$M$_x$O$_{7\pm y}$(M=Fe, Ti, Al, Co, Ga, Pb; $0.5 \leq x \leq 1$), and the Non-Existence of the Parent Phase YSr$_2$Cu$_3$O$_7$," Physica, 1991, pp. 299-306.
Hasegawa, et al., "High $T_c$ Superconductivity of (La$_{1-x}$Sr$_x$)$_2$CuO$_4$—Effect of Substituion of Foreign Ions for Cu and La on Superconductivity," Sup. Jnl. Appl. Phys., Apr., 1987, pp. L337-L338.

Primary Examiner—Paul Lieberman
Assistant Examiner—M. Kopec
Attorney, Agent, or Firm—Welsh & Katz, Ltd.

[57] ABSTRACT

A new copper oxide superconductor of the formula $Ln_{1-x}M_xSr_2Cu_{3-y}Ti_yO_{7+\delta}$ is disclosed, and exhibits a Tc of 60° K. with deviations from linear metallic behavior as high as 130° K.

3 Claims, 1 Drawing Sheet

CUPRATE-TITANATE SUPERCONDUCTOR AND METHOD FOR MAKING

CONTRACTUAL ORIGIN OF THE INVENTION

The United States Government has rights in this invention pursuant to Contract No. W-31-109-ENG-38 between United States Department of Energy and University of Chicago representing the Argonne National Laboratory.

This is a continuation of application Ser. No. 916,338, filed Jul. 17, 1992 now abandoned.

FIELD OF THE INVENTION

This invention relates to a superconductor and a process for preparing it and, more particularly, to an oxide superconductor containing titanium and copper.

BACKGROUND OF THE INVENTION

The term "superconductivity" is generally used in connection with materials exhibiting no resistance to the flow of electric current when cooled below a certain critical temperature ($T_c$). $T_c$ provides a conveniently identified and generally accepted reference point for marking the onset of superconductivity and providing temperature rank using superconductivity in differing materials. Most superconducting materials have a $T_c$ of 125° K.

The primary drawback to the highest of such $T_c$ materials is that they contain elements that are toxic or difficult to handle, which involves not only additional manufacturing costs but environmental concerns as well. An ideal superconducting material would not pose such processing problems and would have a $T_c$ approximately equal to higher than those currently in use. Additionally, an ideal superconductor would be capable of being easily processed into useful form such as wires and cables, a formidable technological challenge for the current classes of ceramic materials which have the drawback of being too brittle to easily work with and form into the necessary shapes for industrial use.

Copper oxide superconductors are inherently brittle, making their processing into wires, discs, or other useful forms difficult. Currently, a preferred technology for the fabrication of wires of these materials involves making a composite of the superconducting compound and a metal phase which functions as a support, a source of tensile strength and protection against conductivity lapses during temperature transitions. Silver is one such metal phase; however, it is prohibitively expensive for large scale applications and often lacks structural integrity after processing the material. Other metal phases often do not protect against oxygen loss from the superconducting phase or migrate into the superconducting phase.

SUMMARY OF THE INVENTION

It is therefore an object of the subject invention to provide an oxide superconductor which has a high $T_c$ and is not toxic or difficult to handle.

A further object of the subject invention is an oxide superconductor containing titanium, in addition to copper, and has a high $T_c$.

A still further object of the subject invention is a superconductive material formed of a copper oxide material containing titanium which is easily formed into a wire.

These and other objects of the subject invention are superconductive material having the formula $Ln_{1-x}M_xSr_2Cu_{3-y}Ti_yO_{7+\delta}$ where $0.15 \leq y \leq 0.50$, $0.15 \leq x \leq 0.5$, $-0.2 \leq \delta \leq 0.4$, and M=Ca, Ba, Sr. The oxides of yttrium, strontium, barium, and copper, or other compounds containing these elements can be used, and when heated to a temperature of 800° C.–1000° C. decompose to yield the copper oxide superconductor of the subject invention. Other lanthanide elements of which terbium, dysprosium, holmium, erbium, and thulium are particularly preferred, may be substituted singly or in combination for yttrium either in whole or in part. Partial substitution of the lanthanide element(s) with calcium is also desirable in tuning the superconducting properties of the described materials. In the process of synthesizing the above superconductive material, $Y_2O_3$, $SrCO_3$, $CuO$, and $TiO_2$ are ground and mixed in the appropriate stoichiometry followed by heating under oxygen atmospheres and temperatures. The sample is then reground, pressed into a pellet, and fired again. The latter process may be repeated as necessary to achieve homogeneity and complete reaction. This material is then fired under high concentrations of oxygen at elevated temperatures and cooled slowly to yield the superconductive material of the subject invention.

DESCRIPTION OF THE DRAWING

The present invention will be more fully understood by reference to the following detailed description thereof when read in conjunction with the attached drawing, wherein.

DETAILED DESCRIPTION OF THE INVENTION

Figure 1:
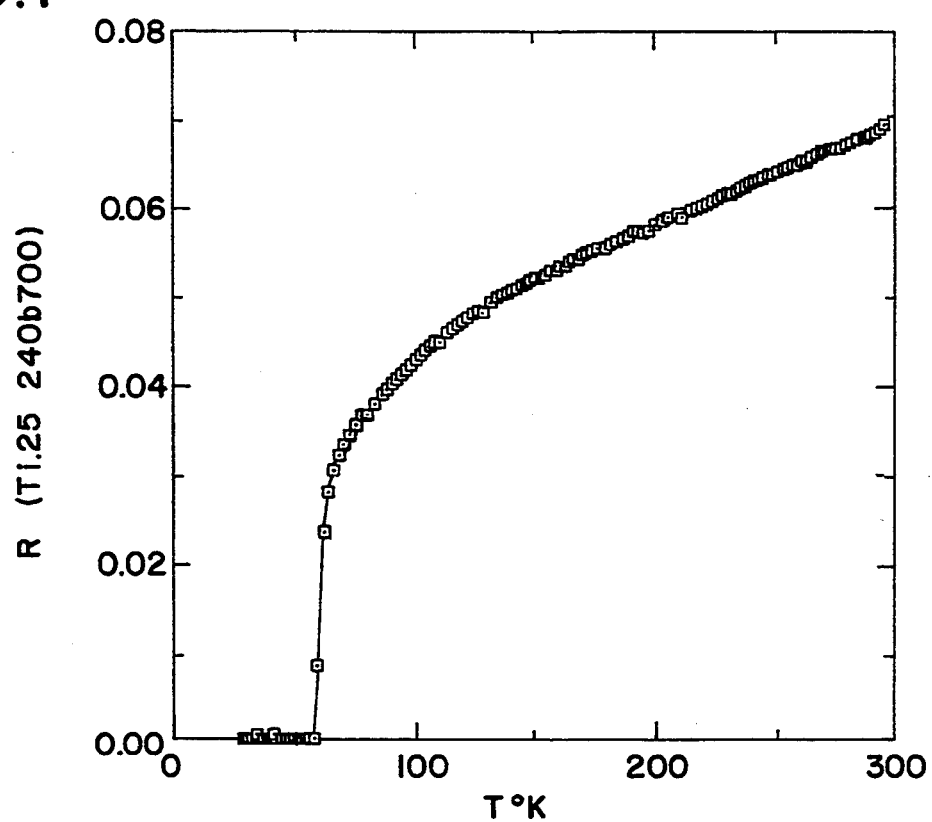
FIG. 1 is a graph illustrating the superconducting transition temperature of the oxide superconductor of the subject invention.

The process of the subject invention involves the synthesis and preparation of a new copper oxide superconductor that contains the element titanium. While small amounts of titanium have previously been incorporated into other copper-oxide superconductors such as $YBa_2Cu_3O_7$, typically extremely small amounts of Titanium are doped into these compounds and generally result in a strong decrease in the $T_c$ of such materials.

$YSr_2Cu_3O_7$ is a superconductor which cannot be prepared at oxygen pressures less than several thousand atmospheres. However, by the subject invention, it is shown that this compound and related phases of this compound can be easily prepared in a stable form by limited cation substitution for copper. A small amount of titanium can be substituted for copper in $YSr_2Cu_3O_7$ in a convenient synthesis process with ordinary laboratory techniques. The acceptable range of substitution may be defined by the formula $Ln_{1-x}M_xSr_2Cu_{3-y}Ti_yO_{7+\delta}$ where $0.15 \leq x \leq 0.5$ and $0.15 \leq y \leq 0.5$. The oxygen content may also vary from 7.0, depending on the processing conditions. Other lanthanide and/or Group II elements may be substituted wholly or partially for yttrium.

The superconducting material of the subject invention may be synthesized by grinding the appropriate stoichiometric amounts of $Y_2O_3$, $SrCO_3$, $CuO$, and $TiO_2$, mixing the ground substances, and heating under an oxygen-containing atmosphere, such as an ambient atmosphere at temperatures from 900° C.–1000° C. and preferably 950° C. for approximately 5–24 hours, preferably 20–24 hours. The mixture is then reground and refused under the same conditions for an additional 20–24 hours; this process is repeated until homogeneity and complete reaction of the material is reached, as determined by x-ray diffraction (XRD). The completely reacted and homogeneous material is then fired in an atmosphere containing 1–600 atmospheres oxygen, and preferably 200–300 atmospheres of oxygen and more preferably 240 atmospheres and a temperature of 400° C.–1200° C., preferably 700° C. The calcined material is then slowly cooled at rates of about 10° C.–50° C./hour to result in a superconductive material of the formula $YSr_2Cu_{3-y}Ti_yO_7$ which can be formed into a wire and other solid objects.

EXAMPLE 1

$YSr_2Cu_{2.75}Ti_{0.25}O_{6.94}$ 535.5 mg, 2.37 mmol (2 mols) of $Y_2O_3$; 1400 mg, 9.48 mmol (8 mols) $SrCO_3$; 1037.3 mg, 13.04 mmol (11 mols) of CuO; and 93.5 mg, 1.19 mmol (1 mol) of $TiO_2$ was combined and ground together into a fine powder and mixed well. This material was placed in an alumina boat and calcined at about 960° C. under ambient atmosphere for about 24 hours. The sample is then reground, pressed into a pellet, and fired at 975° C. for 24 hours. The sample is again reground, pressed into a pellet, and fired for an additional ten days. After one additional cycle of grinding, a partial XRD spectrum showed the material to be nearly pure. (Peaks stated in degrees two theta) 7.66 (6), 23.34(1), 33.22 (100), 39.34 (11), 41.02 (5), 47.74 (19), 59.40 (17), 79.58 (2)). TGA analysis using an $H_2$/He mixture at 900° C. indicated an oxygen content of 6.94 ($\delta = -0.06$). Magnetic susceptibility measurements indicated no superconductivity at temperatures at or above 5 K.

EXAMPLE 2

The material obtained in Example 1 is heated to a temperature of 900° C. under one atm of pure oxygen. The solid is maintained at this temperature for 4 hours and then cooled to 25° C. at a rate of 7° C./h. DC magnetic susceptibility measurements indicates a superconducting transition temperature ($T_c$) of 30 K. TGA analysis using an $H_2$/He mixture at 900° C. indicates an oxygen content of 7.15 ($\delta = 0.15$).

EXAMPLE 3

The material obtained in Example 1 was heated to a temperature of 1050° C. under 600 atmospheres of pure oxygen. The solid was maintained at this temperature for 4 hours and then cooled to 25° C. at a rate of 1° C./min. The resistivity of this treated material was then determined by a four-contact method; $T_c$ was determined to be 36 K. TGA analysis showed 0 =7.22 ($\delta = 0.22$).

Thus, increasing the oxygen atmosphere, and keeping the annealing temperature under between 800° optimizes the oxygen content of the resulting material and, in doing so, increases $T_c$.

EXAMPLE 4

Figure 2:
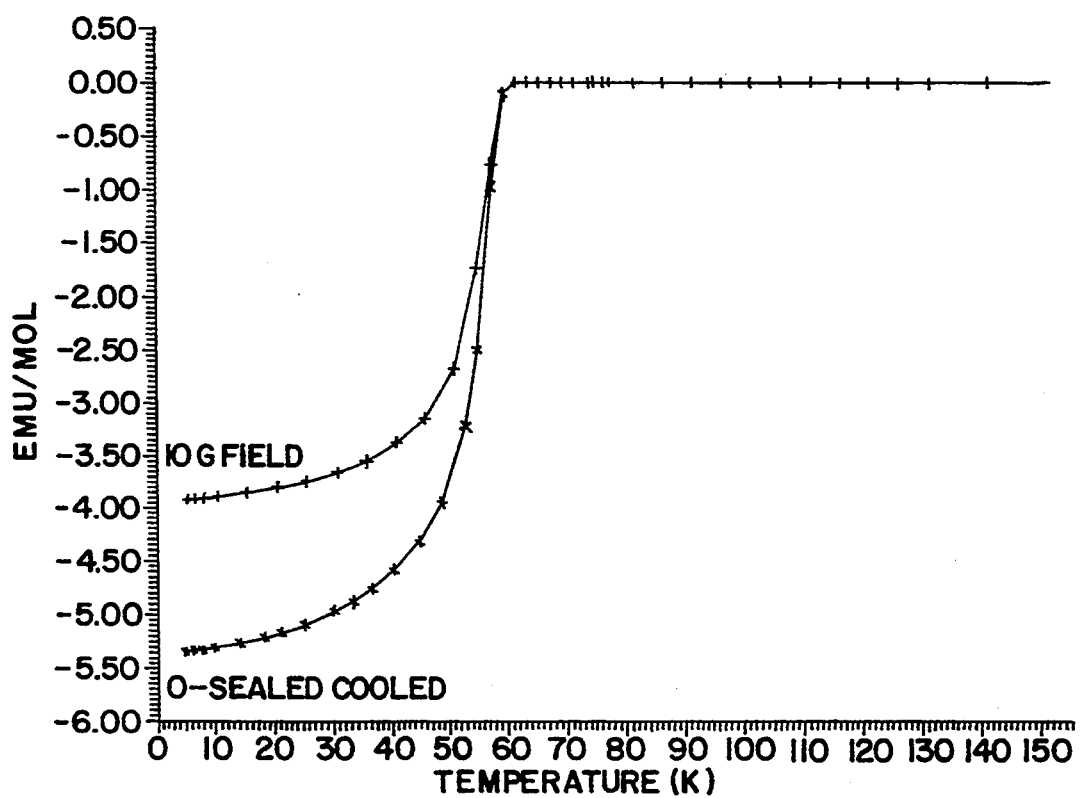
FIG. 2 is a graph of the magnetic susceptibility of the subject invention versus temperature.

The material obtained in Example 1 was heated to a temperature of 700° C. under 240 atmospheres of pure oxygen. This temperature was maintained for 12 hours, and the sample was then cooled at 25° C. at a rate of 0.5° C./min. The resistivity data obtained on this material is shown in FIG. 1, and indicates a $T_c$ of 60 K., with deviations from linear metallic behavior as high as 130 K. The magnetic susceptibility data obtained on this sample (FIG. 2) is in full agreement with this $T_c$ found in the resistivity measurement and indicates a Meissner fraction of 75% with a shielding fraction of 76%. The XRD spectrum of this superconductor showed it to be of the same approximate morphology and purity as before the high pressure treatment. Together, these data demonstrate the material is a homogeneous, well-defined bulk superconductor. TGA measurements indicated an oxygen content of 7.21 ($\delta = 0.21$).

EXAMPLE 5

$YSr_2Cu_{2.6}Ti_{0.4}O_7$ was heated to a temperature of 900° C. under an atmosphere of 0.8% oxygen and 99.2% argon. The solid was maintained at this temperature for 20 hours, and cooled to 25° C. over a period of eight hours. The material was then treated at 700° C. under 240 atmospheres $O_2$ for twelve hours. The material was cooled to ambient temperature at a rate of 0.5°/min. Through resistivity measurements, the onset of superconductivity was observed at 72 K. and $T_c = 66$ K.

Thus, increasing the oxygen concentration of the atmosphere, and keeping the annealing temperature between about 700° and 1000° C. optimizes the oxygen content of the resulting material and, in doing so, increases $T_c$ such as shown in Examples 2–4. However, if a two-step procedure is used whereby the oxygen supply is limited at a higher temperature and then the oxygen supply is significantly increased at a lower temperature, then $T_c$ is substantially increased, as shown by Example 5.

EXAMPLE 6

Preparation of $HoSr_2Cu_{2.65}Ti_{0.35}O_{6.86}$

Holmium oxide ($HO_2O_3$, 8.96.2 mg, 2.37 mmol), strontium carbonate ($SrCO_3$, 1400.6 mg, 9.49 mmol), copper oxide (CuO 100.0 mg, 12.57 mmol), and titanium oxide ($TiO_2$, 131.0 mg, 1.66 mmol) were combined and thoroughly ground, placed into an alumina boat, calcined and homogenized as in Example 1. Total reaction time was ten days. TGA analysis indicated an oxygen content of 6.86 ($\delta = -0.14$). A partial XRD spectrum showed the material to be nearly pure. Representation peaks: 7.48 (12), 23.24 (3), 24.52 (2), 33.10 (100), 39.22 (19), 40.84 (6), 46.10 (3), 47.5o (20), 59.14 (21), 63.26 (5), 69.44 (6), 79.20 (3). Magnetic susceptibility measurements indicated no superconductivity at or above 5 K.

EXAMPLE 7

The material obtained in Example 6 was heated to a temperature of 700° C. under 240 atmospheres of pure oxygen. This temperature was maintained for 12 hours, and the sample was then cooled to 25° C. at a rate of 10° C./hr. The resistivity data indicates a $T_c$ of 54 K. as measured by resistivity.

EXAMPLE 8

Preparation of $Y_{0.8}Ca_{0.2}Sr_2Cu_{2.7}Ti_{0.3}O_{6.92}$

Yttrium oxide ($Y_2O_3$, 611.9 mg, 2.71 mmol), calcium carbonate ($CaCO_3$, 135.6 mg, 1.35 mmol), strontium carbonate ($SrCO_3$, 2000 mg, 13.55 mmol), copper oxide (CuO 1454.9 mg, 18.29 mmol), and titanium oxide ($TiO_2$, 160.3 mg, 2.03 mmol) were combined and thoroughly ground into a fine powder using a mortar and pestle. This material was then placed in an alumina (Al$_2$O$_3$) boat and calcined at a temperature of about 975° C. for about 24 hours under an ambient atmosphere. After one day, the material was again thoroughly homogenized and then pressed into pellet form. This pellet was then refired and the grind/pellet process repeated several times over the course of two weeks. Magnetic susceptibility measurements indicated no superconductivity at or above 5 K.

EXAMPLE 9

The pellets of Example 8 were heated as in Example 6. A $T_c$ of 62 K. was indicated by resistivity measurements.

EXAMPLE 10

$Y_{0.8}Ba_{0.2}Sr_2Cu_{2.75}Ti_{0.25}O_{7+\delta}$ 420.5 mg, 1.32 mmol of Y$_2$O$_3$; 183.8 mg, 0.93 mmol BaCO$_3$ 1374.7 mg, 9.31 mmol of SrCO$_3$; 1000.0 mg, 12.57 mmol of CuO; and 110.2 mg, 1.40 mmol of TiO$_2$ are ground together, mixed well, and heated under ambient atmosphere at a temperature of 975° C. The sample is then reground, pressed into a pellet, and fired repeatedly as in Example 1. The material is then heated under an oxygen atmosphere as in Example 7, followed by slow cooling to yield a bulk superconductor of the formula $Y_{0.8}Ba_{0.2}Sr_2Cu_{2.70}Ti_{0.30}O_{7+\delta}$.

The compounds of the subject invention may be synthesized by other techniques, including but not limited to precipitation methods, chemical vapor deposition, and single-crystal growth from fluxes. Such methods would permit the preparation of thin films and single crystals as has previously been achieved for the other copper oxide superconductors.

An article of the oxide superconductor of the present invention may be formed by filling a monolayered or multilayered metal tube formed of Ti or Ag as the metal phase with the oxide superconductor powder of the subject invention, drawing or rolling the metal tube with the powder in a shape of wire, tape, ribbon, monolith, or disk, and then reheating to sinter the oxide.

EXAMPLE 11

A wire is prepared in accordance with the subject invention. A superconducting material is prepared as set forth in Example 2 and pressed into pellets. These pellets are pulverized by an attrition mill for 10 minutes. Then the resultant powder is charged and sealed into a titanium tube having an outer diameter of 10 mm, inner diameter of 7 mm, and a length of 250 mm, so that the powder has a theoretical density ratio of 0.5.

A drawing step is carried out by means of a drawing bench. The drawing step is repeated until the outer diameter of the tube is reduced down to 2 mm. An annealing step is carried out in an ambient atmosphere at a temperature of 600° C. to 700° C. for a period of 30 minutes to 1 hour. The wire is then subjected to a series of heating and cooling steps as set forth in Example 2.

The wires are further cut in a length of about 30 mm to prepare samples for the examination of superconductivity. The $T_c$ is determined to be 30 K.

EXAMPLE 12

Another tube is prepared by mixing a powder of a superconducting material prepared as in Example 4, which had been heat treated and pulverized, charging and sealing the mixture into a tube of silver. The tube is drawn by means of a drawing bench in a wire until the outer diameter of the wire is reduced down to 2.8 mm and then rolled in a tape of 0.2 mm thick. An annealing step is carried out in an ambient atmosphere at a temperature of 600° C. to 700° C. for a period of 30 minutes to 1 hour. The drawn wire and drawn and rolled tapes are cut in a length of about 100 mm and then subjected to another heat treatment as set forth in Example 9. $T_c$ is shown by resistivity measurements to be 60 K.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents falling within the scope of the appended claims.

Various features of the invention are set forth in the following claims.

What is claimed:

1. A superconducting material of the formula $Ln_{1-x}M_xSr_2Cu_{3-y}Ti_yO_{7+\delta}$ where $0.15 \leq y \leq 0.50$, $0.15 \leq x \leq 0.50$, and $-0.2 \leq \delta \leq 0.4$, M=Ca, Ba, Sr; Ln=Y, Tb, Dy, Ho, Er, Tm.

2. The superconducting material of claim 1 wherein the material is formed in the shape of a wire.

3. The superconducting material of claim 2 wherein said wire is clad with Titanium or Silver.

* * * * *